United States Patent
Sweet et al.

(10) Patent No.: US 7,062,693 B2
(45) Date of Patent: Jun. 13, 2006

(54) METHODOLOGY FOR SELECTIVELY TESTING PORTIONS OF AN INTEGRATED CIRCUIT

(75) Inventors: James Sweet, Sunnyvale, CA (US); Amar Guettaf, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 502 days.

(21) Appl. No.: 10/417,904

(22) Filed: Apr. 17, 2003

(65) Prior Publication Data

US 2004/0210807 A1    Oct. 21, 2004

(51) Int. Cl.
*G01R 31/28* (2006.01)

(52) U.S. Cl. ...................................................... 714/726

(58) Field of Classification Search ................ 714/726, 714/727, 729
See application file for complete search history.

(56) References Cited

U.S. PATENT DOCUMENTS

2002/0194565 A1 * 12/2002 Arabi ........................ 714/729
2003/0140293 A1 * 7/2003 Motika et al. .............. 714/726

* cited by examiner

*Primary Examiner*—Albert Decady
*Assistant Examiner*—James C. Kerveros
(74) *Attorney, Agent, or Firm*—McAndrews, Held & Malloy, Ltd.

(57) ABSTRACT

A method and apparatus are disclosed for easily reconfiguring a scan chain test of a subset of scan blocks within a digital integrated circuit chip. To mitigate timing violations in the scan test of scan chains, alternative embodiments to implement a transfer of scan data to a next scan block are implemented.

19 Claims, 5 Drawing Sheets

METHODOLOGY FOR SELECTIVELY TESTING PORTIONS OF AN INTEGRATED CIRCUIT

RELATED APPLICATIONS

Not Applicable

FEDERALLY SPONSORED RESEARCH OR DEVELOPMENT

Not Applicable

MICROFICHE/COPYRIGHT REFERENCE

Not Applicable

BACKGROUND OF THE INVENTION

Digital integrated circuit chips are composed of many millions of gates that make up various functional components on a chip such as flip-flops, multiplexers, logic circuits, etc. A given chip design may have thousands of flip-flops scattered throughout the chip. A manufacturer may test these flip-flops by shifting in a string of binary ones and zeros through scan chains of flip-flops. The data that is captured at the end of these scan chains is used to validate performance of the chip.

The methodology used to scan test a chip is time-consuming and may require a significant amount of test data in order to validate the performance of the entire chip. A complete scan test of the entire chip is usually performed.

When a portion of an integrated circuit design is modified, resulting in a revised prototype, only a subset of the design is affected. Unfortunately, however, all scan chains must be tested. This results in considerable test time and increased costs of manufacture.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system is provided to selectively enable or bypass the testing of scan chains in one or more layout blocks of a digital integrated circuit. The system comprises a scan multiplexer control module and one or more scan multiplexer modules incorporated in each of the one or more layout blocks. A resynchronization device may be provided in instances where a scan chain has input flip-flops that are triggered by a positive clock transition.

A method is provided for selectively testing one or more scan blocks of a digital integrated circuit. One or more scan blocks are enabled for scan testing by way of control signals generated from a scan multiplexer control module. The scan multiplexer control module generates the appropriate control signals by generating a binary sequence stored in its shift register. A resynchronization device insures that data is securely clocked into the succeeding scan chain when its input flip-flop is triggered by a positive clock transition.

These and other advantages and novel features of the present invention, as well as details of an illustrated embodiment thereof, will be more fully understood from the following description and drawings.

DETAILED DESCRIPTION OF THE INVENTION

Aspects of the present invention provide a method and apparatus to easily and efficiently reconfigure testing of one or more subsets of scan blocks in a digital integrated circuit chip. Example embodiments provided herein illustrate a method and apparatus to selectively control testing of a subset of scan blocks within an integrated circuit chip. One or more scan blocks comprising one or more scan chains of flip-flops are selectively enabled for scan testing by way of a scan multiplexer control module and scan multiplexer modules.

Figure 1:
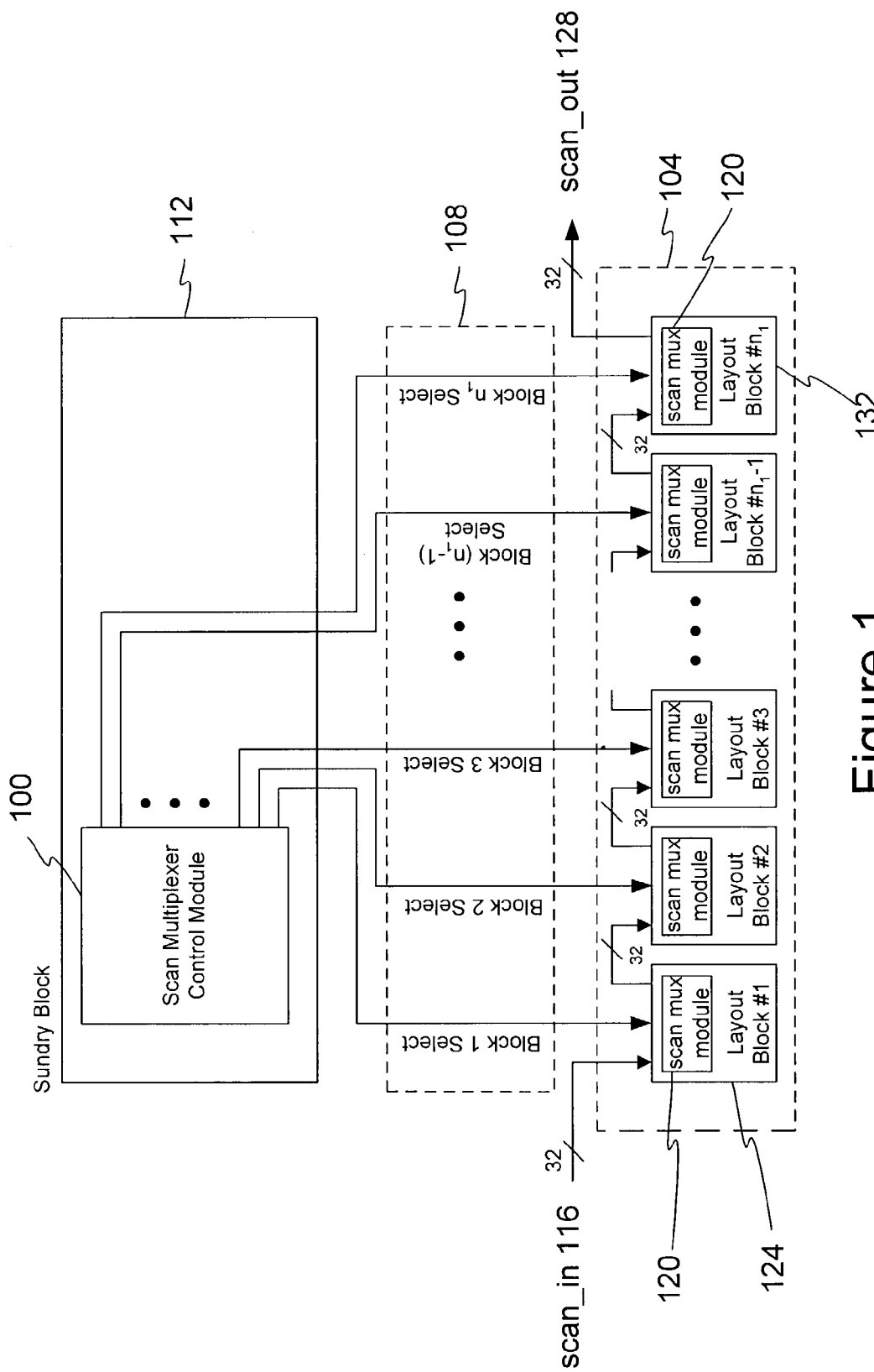
FIG. 1 is a system block diagram illustrating a scan multiplexer control module interconnected to a number of layout blocks in accordance with an embodiment of the invention.

Referring to FIG. 1, in an exemplary embodiment of the present invention, a scan multiplexer control module 100 provides one or more block select control signals 108 to one or more layout blocks 104 within an integrated circuit chip layout. A layout block comprises a scan multiplexer (mux) module 120 and its associated scan block. A scan block comprises a number of scan chains of flip-flops. The scan multiplexer module 120 comprises one or more scan multiplexers (mux). In the embodiment of FIG. 1, the number of scan multiplexers is equivalent to the number of scan chains present in a scan block. As will be shown later, each scan multiplexer is connected to a corresponding scan chain. Each block select control signal provides selective control of all scan multiplexers within a scan multiplexer module 120. In the embodiment of FIG. 1, each block select control signal renders all scan multiplexers in its layout block to either a scan test mode or bypass mode. As illustrated, there are a total of $n_1$ block select control signals 108, each of which provides control to their corresponding layout blocks 104. In one embodiment, it is contemplated there may be more than one control signal per scan block (or layout block) that may act to enable or disable scan testing of various subsets of scan chains.

As illustrated in FIG. 1, scan chain test patterns are provided by way of scan_in signals 116 that enter a first layout block 124 of the $n_1$ layout blocks. Each scan block may comprise one or more scan chains. In the embodiment of FIG. 1, the scan_in signals 116 comprise 32 channels of input test signals corresponding to 32 scan chains in each of the one or more layout blocks 104. The scan_in 116 signals are stitched from block to block and are output from the scan blocks 104 at layout block #$n_1$ 132 as scan_out 128 signals. In other embodiments, the number of input test signals may comprise a number of channels corresponding to the number of scan chains implemented in each of the one or more layout blocks 104.

In the exemplary embodiment of FIG. 1, the scan multiplexer control module 100 is situated within a sundry block 112 of the chip layout. It is contemplated the sundry block 112 comprises an appropriate location within the integrated circuit chip layout to implement the scan multiplexer control module 100.

Figure 2:
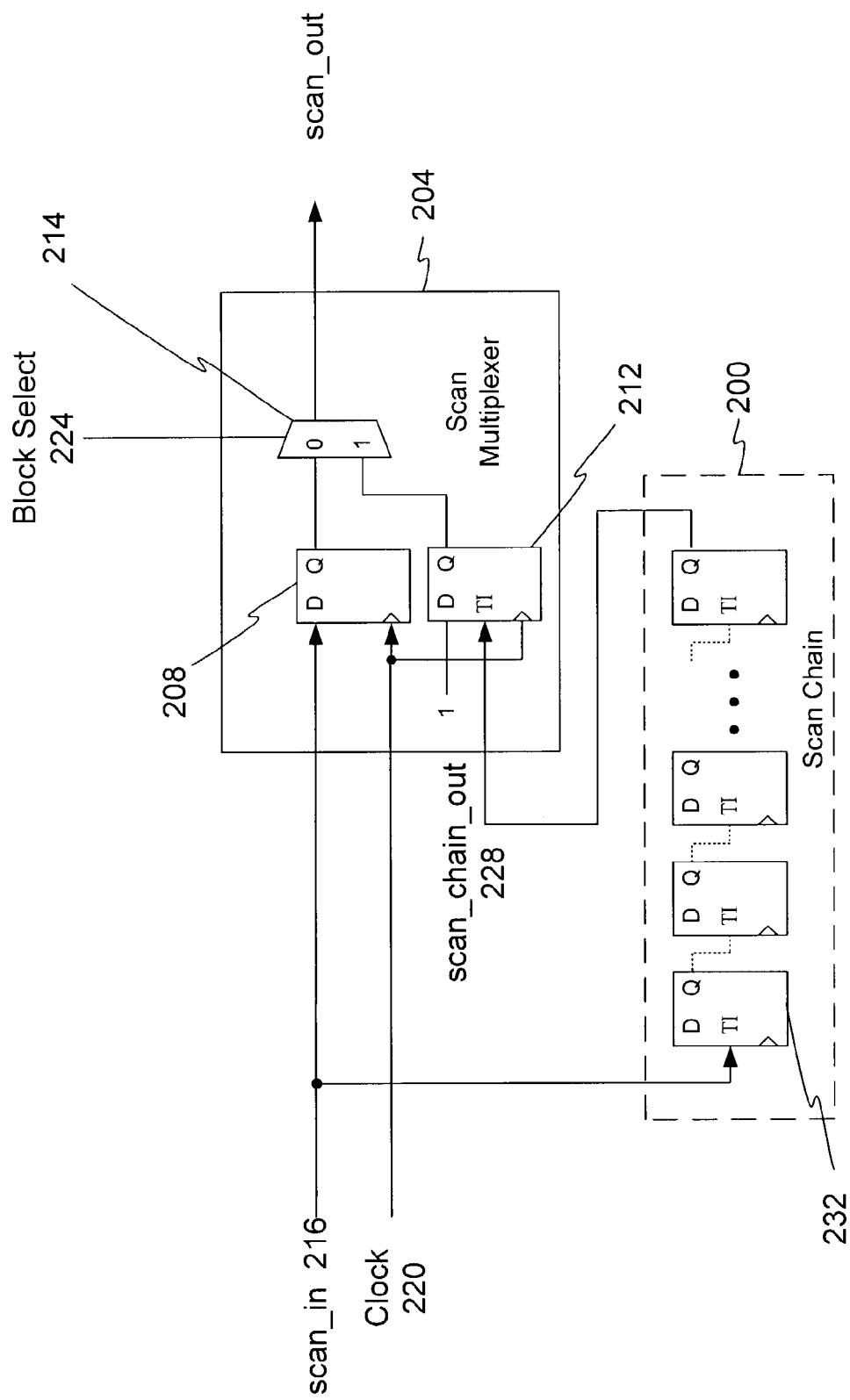
FIG. 2 is a block diagram illustrating a single scan chain and its corresponding scan multiplexer of one of the layout blocks shown in FIG. 1 in accordance with an embodiment of the invention.

FIG. 2 is a block diagram simplified to illustrate only one scan chain 200 and its corresponding scan multiplexer 204 of the 32 scan chains and corresponding scan multiplexers described in the embodiment of FIG. 1. A block select signal 224 generated by the scan multiplexer control module described in FIG. 1 selects either one of two inputs for transmission. The inputs to the scan multiplexer 204 are a scan_in signal 216 and a scan_chain_out signal 228. The scan_chain_out signal 228 is the signal that is output from the scan chain 200. The block select 224 signal determines whether the scan_in 216 signal bypasses the scan chain 200 or is clocked through the scan chain 200.

Referring to FIG. 2, an embodiment of a scan multiplexer 204 is shown, comprising two positive edge-triggered flip-flops 208, 212 and a two input to one output multiplexer 214, in accordance with an embodiment of the invention. The block select signal 224 selects one of two outputs generated from flip-flops 208, 212. A bypass mode occurs when the output of the first flip-flop 208 is selected. On the other hand, a scan test mode occurs when the output of the second flip-flop 212 is selected, generating outputs from the scan chain. In this embodiment, the two flip-flops may comprise, for example, D type flops with test inputs TI (test data input) and TE (test enable input). During scan testing, the second flip-flop 212 as well as the scan chain flip-flops 200 may be placed in the scan test mode by enabling the TE input. It is contemplated that the second flip-flop 212 functions as a buffer between the scan chain 200 and the multiplexer 214. Test data may then be clocked into the flip-flops of the scan chain 200 through the TI inputs. As shown, the output Q of a flip-flop is connected to the input TI of the next flip-flop to create the scan chain 200. A typical scan chain may comprise 5000 to 10,000 flip-flops.

One or more clock signals 220 are used to clock scan test data from a scan chain of a scan block into a next scan block. The embodiment of FIG. 2 is implemented when the first flip-flop in a scan chain 232 is negatively edge-triggered while the last flip-flop in the preceding scan chain is positively edge-triggered. This results in timing characteristic of master/slave flip-flops. As a result, scan test data is successfully clocked from one scan chain in a scan block into the next chain in a succeeding scan block.

Figure 3:
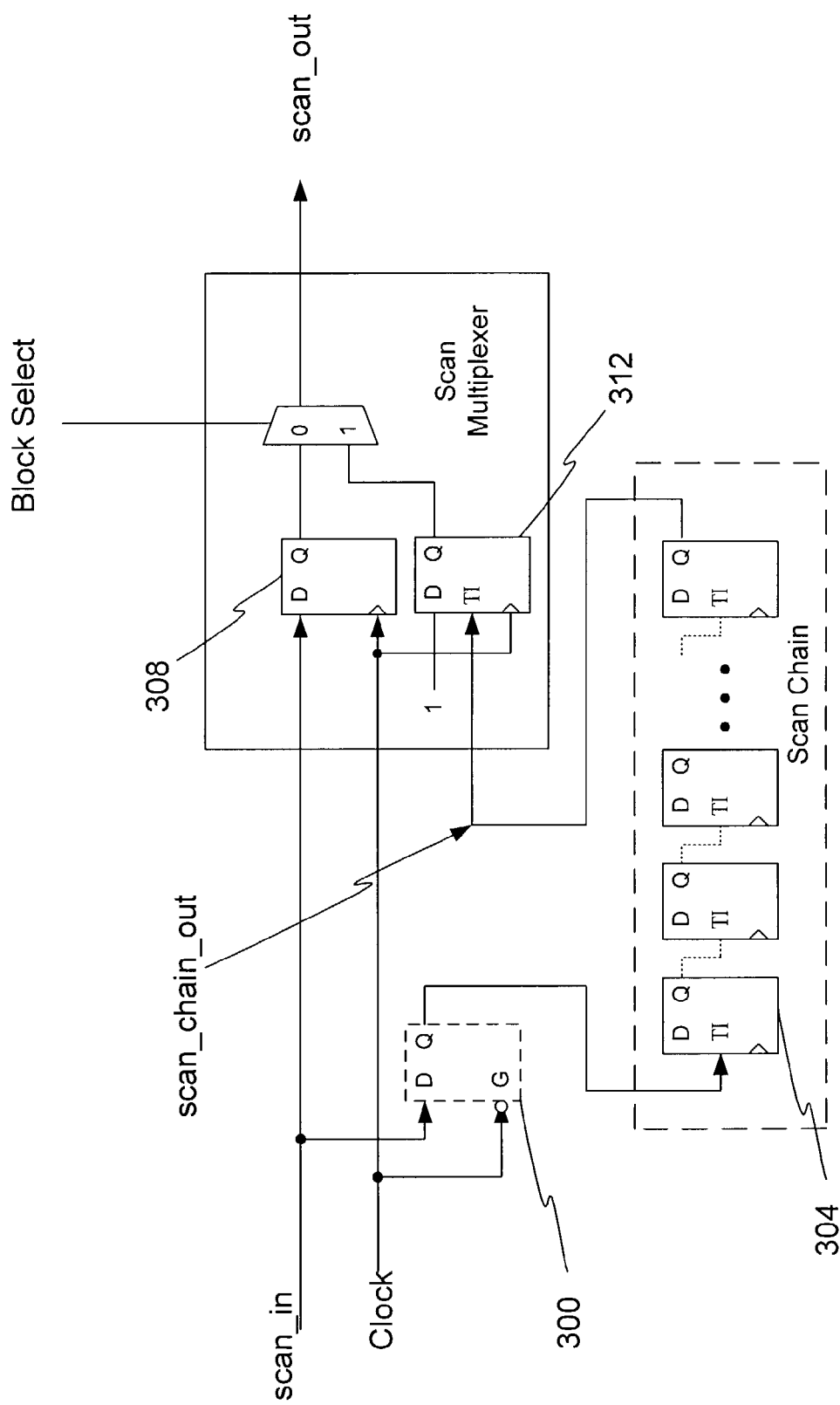
FIG. 3 is a block diagram of the example embodiment shown in FIG. 2 incorporating a lock-up latch, in accordance with en embodiment of the invention.

FIG. 3 illustrates a block diagram incorporating a resynchronization device, such as an exemplary lock-up latch 300 to the embodiment described in FIG. 2, in accordance with an embodiment of the invention. The lock-up latch 300 may be used, for example, when the first flip-flop in a scan chain 304 is a positive edge-triggered flip-flop while the last flip-flop 308 312 in the previous scan chain is also positive edge-triggered. In the embodiment illustrated in FIG. 3, the lock-up latch 300 changes its output (Q) when a negative transition occurs at its gate (G) input. The resulting timing minimizes occurrence of timing violations because the lock-up latch 300 is triggered on a negative transition and is held until the next cycle. When the next flop (first flip-flop in the next scan chain) is triggered on a positive transition, the data provided at its TI input is sampled in the middle of the latch's period, minimizing timing violations. In this fashion, the lock-up latch acts as a resynchronization tool.

Figure 4:
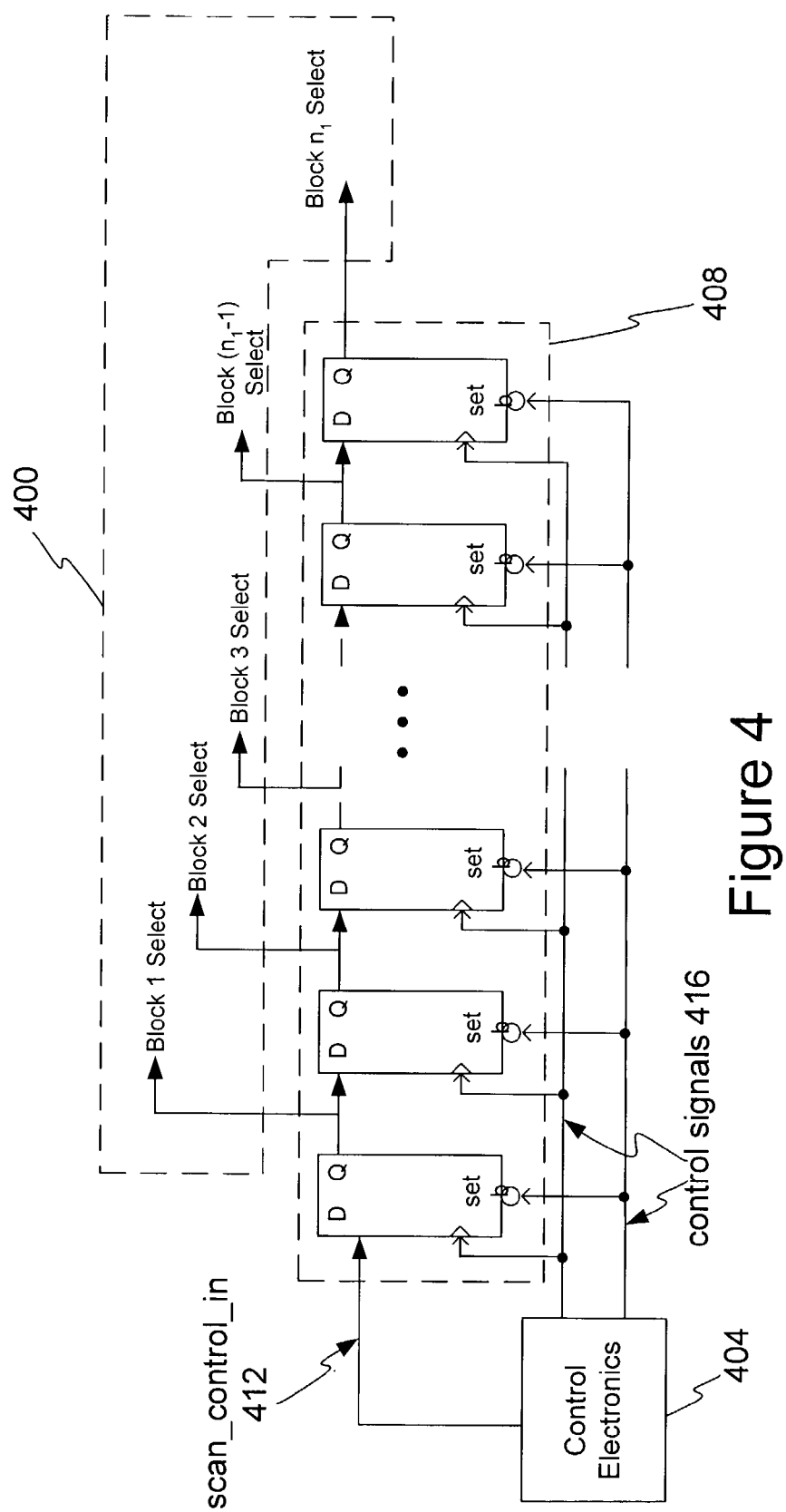
FIG. 4 is an exemplary block diagram of an embodiment of a scan multiplexer control module in accordance with the invention.

FIG. 4 illustrates an exemplary scan multiplexer control module according to an embodiment of the invention. The scan multiplexer control module comprises a number of flip-flops configured to form a shift register 408, and control electronics 404 configured to generate appropriate control signals for clocking in a scan_control_in signal 412. The scan_control_in signal 412 comprises a pattern of binary digits that is shifted into the shift register 408. The shift register 408 generates block select control signals 400 to scan multiplexer modules in order to selectively enable scan testing in one or more layout blocks. It is contemplated the control electronics 404 generates the scan_control_in signal 412 as well as any necessary control signals 416 to allow generation of one or more block select control signals 400 corresponding to one or more layout blocks implemented in an integrated circuit.

Figure 5:
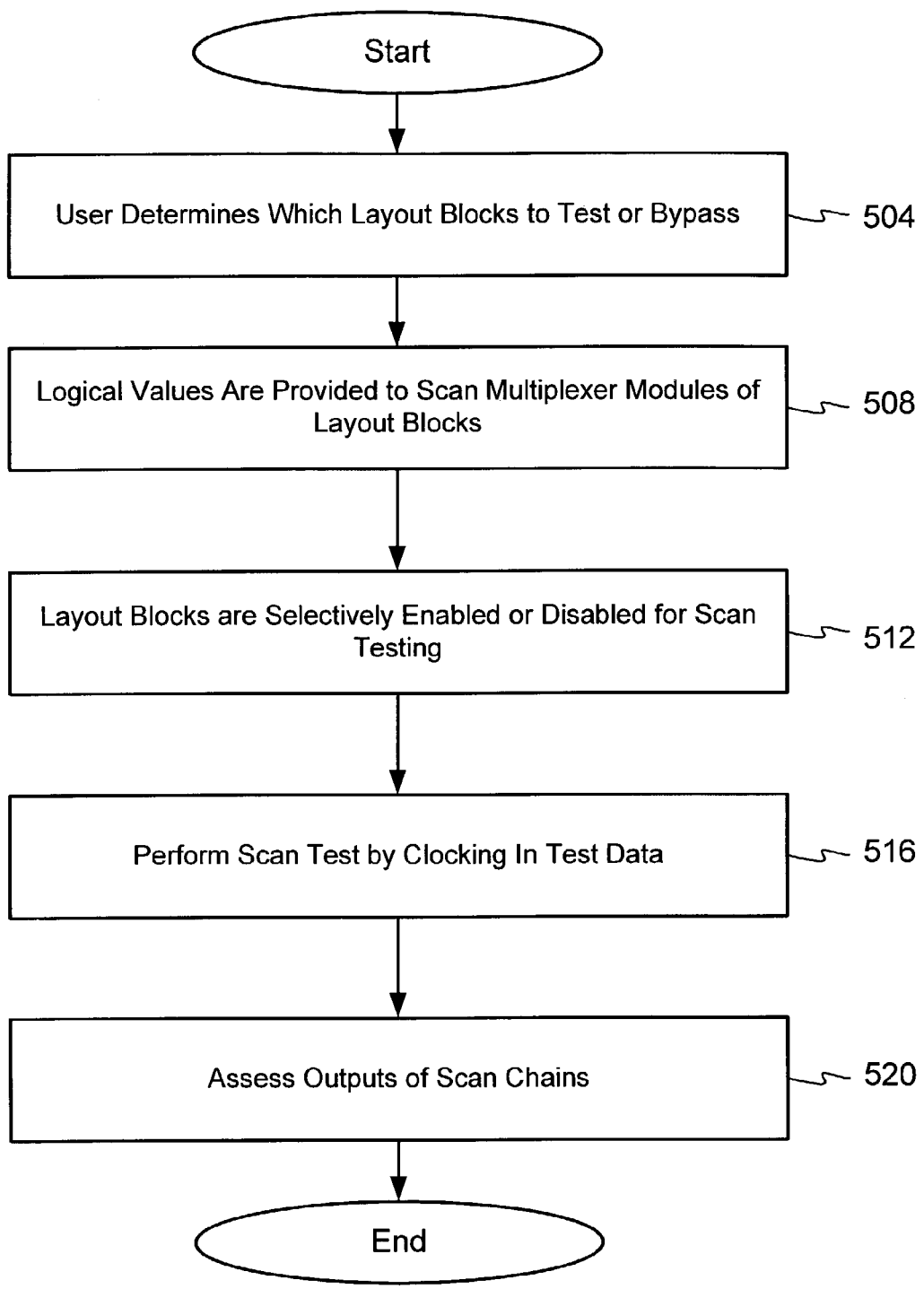
FIG. 5 illustrates an operational flow diagram describing an easily reconfigurable scan block test procedure in accordance with the present invention.

FIG. 5 illustrates an operational flow diagram describing the methodology used for scan testing a subset of layout blocks in an integrated circuit, in accordance with an embodiment of the invention. At step 504, a determination is made concerning which layout blocks to test or to bypass. It is contemplated a user may easily input parameters designating the scan blocks to be tested by way of a computer keyboard or other user interface. At step 508, appropriate logical values are provided to one or more scan multiplexer modules of each layout block by way of control signaling provided by a scan multiplexer control module. At step 512, the layout blocks are selectively enabled or disabled for scan testing. As illustrated in the embodiment of FIG. 4, exemplary control electronics and a shift register generates these logical (binary) values to enable or disable scan testing for each layout block. At step 516, a scan test is performed on enabled layout blocks by shifting in binary scan test data into all scan chains of these blocks. Finally, at step 520, a performance assessment is made based on the resulting output of the tested scan chains.

In summary, aspects of the present invention provide a method and apparatus for selectively enabling scan chain testing of one or more scan blocks in a digital integrated circuit chip. A scan test of a subset of scan blocks is easily performed by selectively reconfiguring a pattern of ones and zeros corresponding to enabling or disabling the testing of scan blocks within a digital integrated circuit. Furthermore, the invention discloses alternate embodiments for effectively clocking scan test data from one layout block to the next.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A system to selectively test a digital integrated circuit comprising:
   a scan multiplexer control module;
   a plurality of scan multiplexer modules; and
   a plurality of scan blocks, each of said scan blocks comprising a plurality of scan chains, each of said scan chains comprising a plurality of scan flip-flops, said scan multiplexer control module generating a plurality of control signals to said plurality of scan multiplexer modules to enable or disable scan chain testing of said plurality of scan blocks, said scan testing performed by transmitting a set of commonly used test pattern signals from a scan block to an adjacent scan block of said plurality of scan blocks.

2. The system of claim 1 wherein each of said plurality of scan multiplexer modules comprises plurality of scan multiplexers configured to provide said enabling or disabling of said scan chain testing by said one or more control signals.

3. The system of claim 2 wherein each of said plurality of scan multiplexers comprises:
 a first flip-flop configured to provide a bypass signal, said bypass signal used for bypassing the scan chain testing of a scan chain using a test pattern signal of said set of test pattern signals;
 a second flip-flop configured for transmitting said test pattern signal of said set of test pattern signals, said test pattern signal processed through said scan chain; and
 a multiplexer having first and second inputs and an output, said first input comprising said bypass signal, said second input comprising said test pattern signal processed through said scan chain;
 wherein a control signal of said plurality of control signals is used to select said first input or said second input as said output.

4. The system of claim 1 wherein each of said plurality of scan chains comprises 5,000 to 10,000 flip-flops.

5. The system of claim 1 further comprising a resynchronization device that is used to maintain a logical state for secure transfer of data from one scan chain in one scan block to a next scan chain in a next scan block.

6. The system of claim 5 wherein said resynchronization device comprises a lock-up latch.

7. The system of claim 1 wherein each of said plurality of scan blocks comprises 32 scan chains.

8. The system of claim 1 wherein the logical states of a string of binary bits input into a shift register of said scan multiplexer control module determine the logical states of said plurality of control signals.

9. The system of claim 1 wherein each of said plurality of scan chains comprises a terminal flip-flop connected to one input of a two input one output multiplexer.

10. The system of claim 1 wherein said set of test pattern signals comprises a number of test signals equal to the number of scan chains used in each scan block of said plurality of scan blocks.

11. A method of testing a digital integrated circuit chip having a plurality of scan blocks comprising:
 generating one or more logical control signals to enable testing of one or more selected scan blocks of said plurality of scan blocks, each of said one or more selected scan blocks comprising a plurality of scan chains; and
 transmitting a set of commonly used test pattern signals from a scan block to an adjacent scan block of said one or more selected scan blocks.

12. The method of claim 11 wherein each of said one or more logical control signals enables or disables scan testing of all scan chains in each of said one or more selected scan blocks of said plurality of scan blocks.

13. A method to selectively scan test one or more scan blocks of a digital integrated circuit chip comprising:
 determining a subset of said one or more scan blocks to be said scan tested;
 generating a set of logical values;
 enabling, based on the logical values generated, the scan testing of said subset of said one or more scan blocks by way of using ones or more corresponding scan multiplexer modules; and
 performing said scan testing of the enabled subset of said one or more scan blocks using a set of test signals commonly used by said one or more scan blocks, said set of test signals stitched from one scan block to another scan block of said one or more scan blocks by way of using said logical values.

14. The method of claim 13 wherein the generating is performed using a scan multiplexer control module.

15. The method of claim 14 further comprising transmitting said logical values from said scan multiplexer control module to said one or more corresponding scan multiplexer modules.

16. A system for testing a digital integrated circuit comprising:
 a plurality of scan blocks, each of said scan blocks comprising a plurality of scan chains;
 a first circuitry for generating one or more control signals, said one or more control signals enabling a subset of said plurality of scan blocks desired to be tested; and
 a second circuitry for selectively stitching a set of test pattern signals through said subset of said plurality of scan blocks using said one or more control signals.

17. The system of claim 16 wherein said first circuitry comprises a scan multiplexer control module comprising a shift register.

18. The system of claim 16 wherein said second circuitry comprises plurality of scan multiplexer modules.

19. The system of claim 16 wherein each of said plurality of scan chains comprises a plurality of flip-flops.

* * * * *

UNITED STATES PATENT AND TRADEMARK OFFICE
CERTIFICATE OF CORRECTION

| | |
|---|---|
| PATENT NO. | : 7,062,693 B2 |
| APPLICATION NO. | : 10/417904 |
| DATED | : June 13, 2005 |
| INVENTOR(S) | : James Sweet et al. |

It is certified that error appears in the above-identified patent and that said Letters Patent is hereby corrected as shown below:

In claim 13, at col. 6, line 18, after the word "using", delete "ones" and insert --one--.
In claim 18, at col. 6, line 46, after the word "comprises", insert --a--.

Signed and Sealed this

Fifth Day of September, 2006

JON W. DUDAS
*Director of the United States Patent and Trademark Office*

UNITED STATES PATENT AND TRADEMARK OFFICE
CERTIFICATE OF CORRECTION

PATENT NO. : 7,062,693 B2
APPLICATION NO. : 10/417904
DATED : June 13, 2006
INVENTOR(S) : James Sweet et al.

It is certified that error appears in the above-identified patent and that said Letters Patent is hereby corrected as shown below:

In claim 13, at col. 6, line 18, after the word "using", delete "ones" and insert --one--.
In claim 18, at col. 6, line 46, after the word "comprises", insert --a--.

This certificate supersedes Certificate of Correction issued September 5, 2006.

Signed and Sealed this

Seventh Day of November, 2006

JON W. DUDAS
*Director of the United States Patent and Trademark Office*